(12) United States Patent
Queirolo et al.

(10) Patent No.: US 6,303,472 B1
(45) Date of Patent: Oct. 16, 2001

(54) PROCESS FOR CUTTING TRENCHES IN A SINGLE CRYSTAL SUBSTRATE

(75) Inventors: Giuseppe Queirolo, Milan; Giampiero Ottaviani, Modena; Gianfranco Cerofolini, Milan, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/106,624

(22) Filed: Jun. 29, 1998

(30) Foreign Application Priority Data

Jul. 3, 1997 (EP) .................................................. 97830335

(51) Int. Cl.$^7$ .................................................. H01L 21/30
(52) U.S. Cl. ........................... 438/482; 438/455; 438/482
(58) Field of Search ..................................... 438/458, 406, 438/222, 482

(56) References Cited

U.S. PATENT DOCUMENTS

| 3,982,967 | | 9/1976 | Ku et al. . |
|---|---|---|---|
| 5,374,564 | * | 12/1994 | Bruel . |
| 5,416,043 | | 5/1995 | Burgener et al. . |
| 5,494,835 | * | 2/1996 | Bruel . |
| 5,804,086 | * | 9/1998 | Bruel . |
| 5,877,070 | * | 3/1999 | Goesele et al. . |
| 6,020,252 | * | 1/2000 | Aspar et al. . |

FOREIGN PATENT DOCUMENTS

| 0 660 140 A1 | 12/1994 | (EP) | ................................ | G02B/5/18 |
| 2 211 991 | 7/1989 | (GB) | ............................. | H01L/21/76 |

OTHER PUBLICATIONS

Q.Y. Tong et al., Low Temp. Si Layer Splitting, p. 126–127, (IEEE) Oct. 1997.*
M. Bruel et al., "Smart Cut": A Promising New Soi Material Tech., pp. 178–179, (IEEE) Oct. 1995.*
H.Moriceau et al., Cleaning and Polishing as key steps for Smart–Cut, Soi process, pp. 152–153, (IEEE) Oct. 1996.*

* cited by examiner

*Primary Examiner*—Charles Bowers
*Assistant Examiner*—Scott J Hawranek

(57) ABSTRACT

A process for cutting a trench in a silicon monocrystal in areas defined by a mask comprises forming a mask that defines an etched area on the surface of a monocrystalline silicon wafer which is eventually covered by a thin layer of oxide. Next, ions are implanted with a kinetic energy and in a dose sufficient to amorphize the silicon down to a pre-defined depth within the defined area, while maintaining the temperature of the wafer sufficiently low to prevent relaxation of point defects produced in the silicon and to prevent diffusion of the implanted ions in the crystal lattice of the silicon adjacent to the amorphized region. Dislodgment and expulsion of the amorphized portion in correspondence with interface with the adjacent crystal lattice of the silicon is initiated by heating the implanted wafer.

20 Claims, No Drawings

PROCESS FOR CUTTING TRENCHES IN A SINGLE CRYSTAL SUBSTRATE

FIELD OF THE INVENTION

The present invention relates in general to fabrication processes for integrated semiconductor devices, and, more particularly, to a technique for cutting trenches in specific areas of a crystalline substrate.

BACKGROUND OF THE INVENTION

The rapid spread and sophistication of portable electronic apparatus commonly using microprocessors and complex monolithically integrated systems has made current consumption critical. That is energy consumption of battery powered portable apparatus is a concern. From a technological point of view, a response to the demand for reduced energy consumption is substantially that of further increasing the density of integration. In other words, as size reduction of individual integrated structures is performed, sub-micron dimensions have become half-micron dimensions. Of course, the scaling down process also includes reducing the supply voltage which permits a significant energy savings.

The scaling down process has strong repercussions on certain processing steps, referred to as the "front end" of the fabrication process. In traditional integration architectures, maintaining a high degree of flatness is fundamental in alleviating the criticality of successive masking steps. Along these lines, isolation areas among the distinct integrated structures may be advantageously realized by cutting trenches in the silicon that are then filled with dielectric materials. Other integration architectures, such as USLI (Ultra Large Scale Integration), may benefit from the possibility of cutting extremely precise and controlled trenches in a silicon monocrystal or in a polysilicon layer.

According to known techniques, such trenches are produced by anisotropic etching through the apertures of a resist mask, typically using Reactive Ion Etching (R.I.E.) techniques. These techniques have the disadvantage of being based on the etching time in the absence of appropriate markers to halt the etching once a predefined depth is reached. Moreover, the use of special gas mixtures of reactive compounds may leave undesired residues on the etched surface.

SUMMARY OF THE INVENTION

The object of the present invention is to provide a more effective way of cutting trenches in a monocrystalline substrate or in a crystalline layer.

This object is fully attained by the process of the invention which includes implanting ions of atomic weight and kinetic energy sufficient to amorphize the crystalline material for a predefined depth in an area defined by an ion implant mask. This is performed while keeping the temperature of the target crystalline material sufficiently low to prevent any appreciable diffusion of the implanted ions in the crystal lattice adjacent to the amorphized region (that is, the region of impact and arrest of ions). Hence, instead of using relatively heavy ions at ambient temperature, it is preferable to use relatively light ions such as He or B ions, at a sufficiently low temperature (i.e. at the boiling temperature of liquefied nitrogen in the vicinity of −196° C.).

The implant dose must be sufficient to completely amorphize the crystalline material in the ion region of arrest (that is, to substantially destroy any appreciable ordered scheme of mutual atomic arrangement) with the consequent creation of a highly stressed region by the incorporation of a massive dose of implanted ions.

DETAILED DESCRIPTION OF THE PREFERRED EMBODIMENTS

A fundamental aspect of the trench cutting process of the invention rests on the fact that the interstitial defects and the reticular vacancies created by the bombardment of ions are prevented from shifting by the relatively low temperature at which the ion bombardment is carried out. The bombardment of ions is to amorphize the crystalline material for a predefined depth in an area defined by an ion implant mask.

Preferably, the implanted ions should be ions of non-reactive elements like helium, argon and neon even though reactive ions like hydrogen, boron and fluorine ions may be used. This is so because by keeping the crystalline target at an adequately low temperature, diffusion of the ions implanted in the crystalline lattice remains substantially negligible. At the end of the implant, the temperature is rapidly raised causing the spalling of the whole amorphized material off the adjacent crystalline matrix which occurs in correspondence with the interface between the two regions.

By keeping the crystalline substrate to a temperature of −196° C. (the boiling point of nitrogen), the ions implanted for a precisely defined depth as a function of the kinetic energy of the accelerated ions, and in a sufficiently high dose, determine an amorphization of the crystalline matrix provoked through a mechanism of multiple shifts of the atoms of the implanted crystalline lattice. The dose in the case of a silicon substrate may be generally in the range of $5 \times 10^{16}$ atoms/cm$^2$.

By virtue of the low temperature preventing any diffusion motion of point defects originated in the solid by the bombardment, the implanted ions themselves are prevented from diffusing in the adjacent crystal lattice. This determines a spatial distribution of the implanted ions characterized by an abrupt step in coincidence with both the vertical walls and the bottom of the amorphized zone.

Through a very fast increase of the temperature up to several hundreds ° C., usually up to at least 400–500° C., or even higher, and preferably to approximately 700–750° C. of the implanted substrate, a sharp separation of the amorphized portion from the crystalline matrix occurs with an "explosive" dynamic effect. In practice, the amorphized material is violently dislodged and expelled out of its position leaving a trench in the crystalline material with upright walls and an extremely flat bottom surface. Test analysis and observations confirm an exceptionally good correlation between the depth of implanted ions, and the effective depth of the trench produced by the dislodgment and expulsion of the amorphized material during the rapid heat treatment.

The ion implant may be successfully carried out through a sufficiently thick resist mask to effectively shield the surrounding crystalline material from the amorphizing ion bombardment. A resist mask of about 1 μm of thickness is satisfactory for the purpose. Special resists may provide an effective shielding even with a thickness of less than 1 μm.

Having conducted preliminary tests on a monocrystalline silicon wafer at the boiling temperature of nitrogen, it has been determined that under normal vacuum conditions of ion implantation ($<10^{-6}$ Torr), an upper limit temperature for adequately inhibiting diffusion of implanted ions in the surrounding crystalline lattice, as a function of both the kind of the crystalline material and of the implanted species, could not be established. For example, it has been proven that when implanting Boron ions, the temperature of −80° C. is still too high to effectively prevent rearrangement processes, while the temperature of liquefied nitrogen (−196° C.) is to be considered as a lower limit value beyond which the technique does not seem to operate.

The process has proven itself effective for cutting trenches deep into a silicon monocrystal having a predefined depth of 0.5 μm (or even less) to approximately 2.0 μm or more. Parallel trenches, of 0.5 μm width or even less, may be cut in a silicon monocrystal by implanting helium ions accelerated between 15 and 30 KeV and in doses of about $5 \times 10^{16}$ atoms/cm².

At the end of the implant, the wafers are heated up to 700° C. with a heating rate preferably between 1 and 0.5° C./sec or even higher. Heating rates of less than about 0.5° C./sec tend to progressively reduce the effectiveness of the method up to a point of losing the essential reproducibility requirement when the rates are just about 0.1–0.3° C./sec.

In the light of the preliminary experiments conducted so far it would appear that by appropriately modulating the rate of heating during dislodgment and expulsion of the amorphized material, the minimum definition without occurrences of discontinuities in the trenches and of the separation of crystalline material between two adjacent trenches is reduced.

That which is claimed is:

1. A process for forming a trench in a silicon wafer, the process comprising the steps of:

forming a mask that defines an etch area on a surface of the silicon wafer to be eventually covered by a thin layer of oxide;

implanting ions with a kinetic energy and in a dose sufficient to amorphize the silicon to a depth within the defined etch area, while maintaining the temperature of the silicon wafer at less than about −80° C. to prevent relaxation of point defects produced in the silicon and to prevent diffusion of the implanted ions in a crystal lattice of the silicon adjacent to the amorphized region; and heating the implanted wafer causing dislodgment and expulsion of the amorphized region in correspondence with an interface with the adjacent crystal lattice to thereby form the trench.

2. A process of claim 1, wherein the step of implanting comprises implanting with helium ions with a kinetic energy in a range of about 15 to 30 KeV, in a dose of about $5 \times 10^{16}$ atoms/cm², and at a temperature less than or equal to about −196° C.

3. A process of claim 2, wherein the step of heating comprises heating the silicon to a temperature higher than about 400° C. at a rate greater than about 0.5° C./sec.

4. A process of claim 3, wherein the heating occurs at a rate in a range of about 1° C./sec to 5° C./sec.

5. A process of claim 1, wherein the step of forming a mask comprises forming a mask so that a dimension of the defined etch area is less than about 5 μm.

6. A process of claim 1, wherein the step of implanting comprises implanting with reactive ions.

7. A process of claim 6, wherein the reactive ions comprise at least one hydrogen, boron and fluorine ions.

8. A process of claim 1, wherein the step of implanting comprises implanting with non-reactive ions.

9. A process of claim 8, wherein the non-reactive ions comprise at least one of helium, argon and neon.

10. A process for forming a trench in a semiconductor layer, the process comprising the steps of:

masking an etch area on a surface of the semiconductor layer;

implanting ions with a kinetic energy and in a dose sufficient to amorphize the semiconductor layer to a depth within the defined etch area, while maintaining the temperature of the semiconductor layer at less than about −80° C. to reduce relaxation of point defects produced in the semiconductor layer and to reduce diffusion of the implanted ions in a crystal lattice of the semiconductor layer adjacent to the amorphized region; and heating the semiconductor layer causing dislodging of the amorphized region in correspondence with an interface with the adjacent crystal lattice of the semiconductor layer to thereby form the trench.

11. A process of claim 10, wherein the step of masking comprises the step of selectively covering the semiconductor layer with a layer of resist.

12. A process of claim 10, further comprising the step of filling the trench with dielectric material.

13. A process of claim 10, wherein the step of implanting comprises implanting with helium ions with a kinetic energy in a range of about 15 to 30 KeV, in a dose of about $5 \times 10^{16}$ atoms/cm², and at a temperature less than or equal to about −196° C.

14. A process of claim 13, wherein the step of heating comprises heating the semiconductor layer to a temperature higher than about 400° C. at a rate greater than about 0.5° C./sec.

15. A process of claim 14, wherein the heating occurs at a rate in a range of about 1° C./sec to 5° C./sec.

16. A process of claim 10, wherein the step of forming a mask comprises forming a mask so that a dimension of the defined etch area is less than about 5 μm.

17. A process of claim 10, wherein the step of implanting comprises implanting with reactive ions.

18. A process of claim 17, wherein the reactive ions comprise at least one of helium, boron and fluorine.

19. A process of claim 10, wherein the step of implanting comprises implanting with non-reactive ions.

20. A process of claim 19, wherein the non-reactive ions comprise at least one of helium, argon and neon.

* * * * *